(12) United States Patent
Li et al.

(10) Patent No.: US 11,540,385 B2
(45) Date of Patent: Dec. 27, 2022

(54) BACKLIGHT SOURCE AND DISPLAY DEVICE

(71) Applicants: Beijing BOE Optoelectronics Technology Co., Ltd., Beijing (CN); BOE Technology Group Co., Ltd., Beijing (CN)

(72) Inventors: Sa Li, Beijing (CN); Xingjun Shu, Beijing (CN); Xiujun Cai, Beijing (CN); Wenli Lan, Beijing (CN); Yue An, Beijing (CN); Fuan Zhu, Beijing (CN); Yadong Zhang, Beijing (CN); Zuocheng Zhu, Beijing (CN); Runfei Du, Beijing (CN); Jiaqiang Wang, Beijing (CN); Xingpan Sun, Beijing (CN); Tingting Zhao, Beijing (CN); Jianwu Wu, Beijing (CN)

(73) Assignees: Beijing BOE Optoelectronics Technology Co., Ltd., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/485,155

(22) Filed: Sep. 24, 2021

(65) Prior Publication Data
US 2022/0210909 A1   Jun. 30, 2022

(30) Foreign Application Priority Data
Dec. 25, 2020  (CN) .......................... 202023195973.5

(51) Int. Cl.
  H05K 1/02   (2006.01)
  H05K 1/18   (2006.01)
  H05K 1/11   (2006.01)

(52) U.S. Cl.
  CPC ........... H05K 1/0259 (2013.01); H05K 1/111 (2013.01); H05K 1/181 (2013.01); H05K 2201/10106 (2013.01)

(58) Field of Classification Search
  CPC ...... H05K 1/0259; H05K 1/111; H05K 1/181; H05K 2201/10106
  See application file for complete search history.

(56) References Cited

U.S. PATENT DOCUMENTS

2018/0196309 A1*  7/2018  Zhou ..................... H05B 45/24

* cited by examiner

*Primary Examiner* — Anne M Hines
(74) *Attorney, Agent, or Firm* — IPro, PLLC

(57) ABSTRACT

The disclosure relates to the technical field of backlight structures, and discloses a backlight source and a display device. The backlight source includes a light bar and a metal frame; the side, containing the light bar, of the metal frame has a notch; the light bar includes a light-emitting unit; the light-emitting unit includes a plurality of light-emitting groups; each light-emitting group includes at least one first light-emitting group and at least one second light-emitting group, the first light-emitting group includes N light-emitting elements, the light-emitting element numbered n is connected in series with the light-emitting element numbered n+1 successively, the light-emitting element numbered 1 and the light-emitting element numbered N are arranged adjacently, and the light-emitting element numbered 1 and the light-emitting element numbered 2 are the farthest apart.

20 Claims, 4 Drawing Sheets

BACKLIGHT SOURCE AND DISPLAY DEVICE

The present disclosure claims the priority from Chinese Patent Application No. 202023195973.5, filed with the Chinese Patent Office on Dec. 25, 2020, and entitled "BACKLIGHT SOURCE AND DISPLAY DEVICE", which is hereby incorporated by reference in its entirety.

FIELD

The disclosure relates to the technical field of backlight structures, in particular to a backlight source and a display device.

BACKGROUND

In the process of assembling a display device, semi-finished products of a light bar and a reflector are assembled into an iron frame in an oblique insertion way. In order to prevent the extending end of the light-emitting element LED (light-emitting diode) on the light bar from interfering with the iron frame, the iron frame needs to be perforated, so the perforated position is exposed.

During the electro-static discharge (ESD) test, because the perforated position is unprotected, static electricity can directly act on pins of the LED, resulting in LED damage. The original design adopts the edge-covering mylar to wrap the perforated position, but due to the manufacturing process and assembly capabilities, the perforated position cannot be completely sealed and cannot prevent static electricity from entering.

SUMMARY

The disclosure provides the following technical solutions.

In the first aspect, the disclosure provides a backlight source, including a light bar and a metal frame;

the light bar is located on one side of the metal frame; and the side, containing the light bar, of the metal frame has a notch;

the light bar includes a light-emitting unit;

the light-emitting unit includes a plurality of light-emitting groups;

each of the plurality of light-emitting groups include at least one first light-emitting group and at least one second light-emitting group;

the first light-emitting group includes N light-emitting elements; the light-emitting element numbered n is connected in series with the light-emitting element numbered n+1 successively, where $1 \leq n \leq N-1$; the light-emitting element numbered 1 and the light-emitting element numbered N are arranged adjacently; and the light-emitting element numbered 1 and the light-emitting element numbered 2 are the farthest apart; and the second light-emitting group includes M light-emitting elements; the light-emitting element numbered m is connected in series with the light-emitting element numbered m+1 successively, where $1 \leq m \leq M-1$; and the light-emitting element numbered 1 and the light-emitting element numbered M are the farthest apart.

According to the above-mentioned backlight source, the backlight source includes the metal frame and the light bar arranged on one side of the metal frame. Specifically, the metal frame is provided with a notch on the side provided with the light bar; the light bar includes a light-emitting unit, the light-emitting unit includes a plurality of light-emitting groups, and each light-emitting group includes at least one first light-emitting group and at least one first light-emitting group. When the first light-emitting group and the second light-emitting group are specifically set, the first light-emitting group includes N light-emitting elements, and the second light-emitting group includes M light-emitting elements. When the M light-emitting elements in the second light-emitting group are specifically set, the light-emitting element numbered m and the light-emitting element numbered m+1 in the M light-emitting elements are connected in series, so that the light-emitting element numbered 1 and the light-emitting element numbered M are the farthest apart. In other words, the M light-emitting elements in the second light-emitting group are arranged in sequence and connected in series according to their physical positions. When the N light-emitting elements in the first light-emitting group are specifically set, the light-emitting element numbered n is connected in series with the light-emitting element numbered n+1 successively, the light-emitting element numbered 1 and the light-emitting element numbered N are arranged adjacently, and the light-emitting element numbered 1 and the light-emitting element numbered 2 are the farthest apart. In other words, the N light-emitting elements in the first light-emitting group are not arranged in sequence and connected in series according to their physical positions. Specifically, when the static electricity entering from the notch acts on the light-emitting element numbered 1 in the first light-emitting group, the electrostatic current flows along the light-emitting element numbered 1 through the light-emitting elements in the series-connected circuit until the current is transferred to the light-emitting element numbered N. Electrostatic energy flows through the entire series-connected first light-emitting group, so that the electrostatic energy is dispersed.

The above-mentioned backlight source changes the positions of multiple light-emitting elements in the first light-emitting group to make the light-emitting element on which the electrostatic current acts be regarded as the light-emitting element numbered 1 in the first light-emitting group, so that the electrostatic energy can flow along the light-emitting element numbered 1 to the light-emitting element numbered N sequentially. In such a way, the electrostatic energy can be dispersed, and one light-emitting element can be prevented from being subjected to electrostatic energy alone, thereby achieving the effect of preventing ESD from damaging a single light-emitting element.

Optionally, the orthographic projection of the first light-emitting group on the metal frame at least partially covers the notch, and the orthographic projection of the second light-emitting group on the metal frame and the notch are non-overlapped.

Optionally, the light bar further includes a circuit board, the circuit board includes a first circuit board and a second circuit board that are connected to each other, and the light-emitting unit is located on the first circuit board.

Optionally, the orthographic projection of the second circuit board on the metal frame is at least partially located in the notch, and the second circuit board and the metal frame are non-overlapped.

Optionally, the first circuit board has middle pads, a first pole and a second pole of each light-emitting element are respectively fixed to two adjacent middle pads, and the light-emitting group has at least one positive pad.

Optionally, the second circuit board has at least one positive input terminal and at least one negative input terminal, one of the light-emitting groups is arranged between the positive input terminal and the negative input terminal, the positive input terminal is electrically connected to a positive pole of the light-emitting element numbered 1 in the one light-emitting group through a positive pad, and the negative input terminal is electrically connected to a negative pole of the light-emitting element numbered N or M in the one light-emitting group.

Optionally, the orthographic projection of the light-emitting element numbered 1 in the first light-emitting group on the metal frame is at least partially located in the notch.

Optionally, the width of the notch is one time or above the width of the second circuit board.

In the second aspect, the disclosure also provides a display device, including a display panel and any one of the backlight sources provided by the above technical solutions.

DETAILED DESCRIPTION OF THE EMBODIMENTS

In order to make the purpose, technical solutions and advantages of the disclosure clearer, the disclosure will be further described in detail below in conjunction with the accompanying drawings. Obviously, the described embodiments are only a part of the disclosure, rather than all of the embodiments. Based on the embodiments of the disclosure, all other embodiments obtained by those of ordinary skill in the art without creative work shall fall within the scope of protection of the disclosure.

Figure 1:
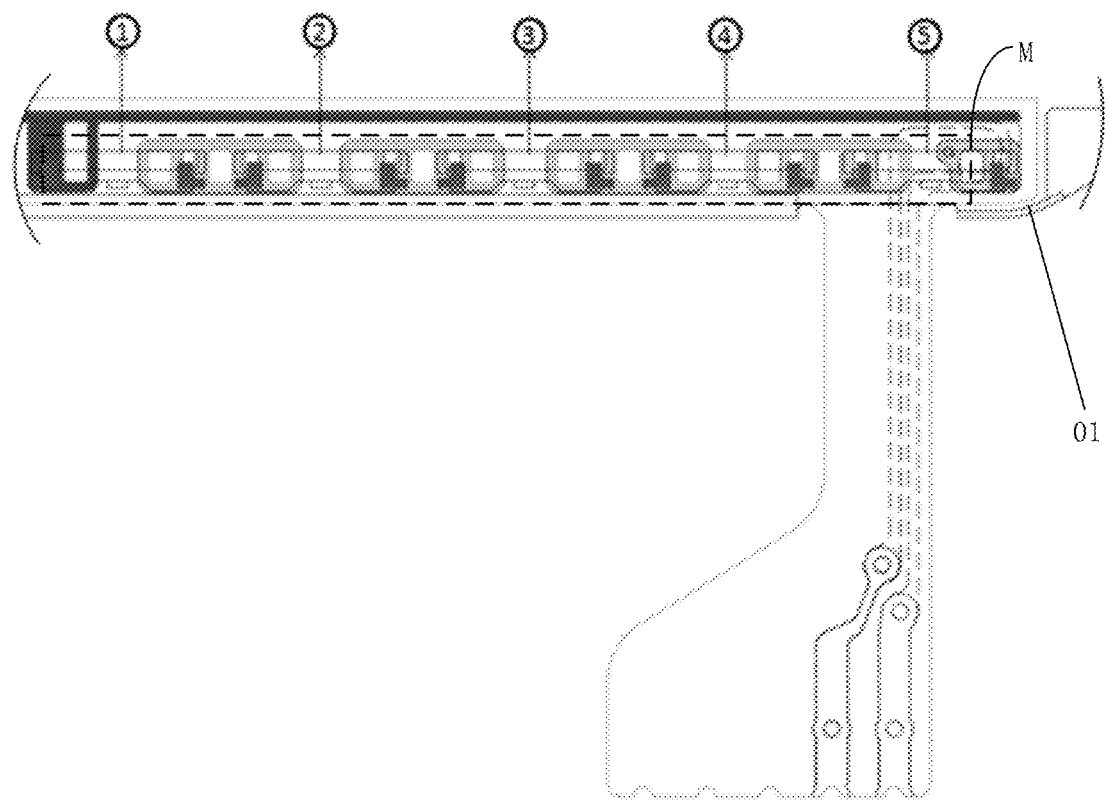
FIG. 1 is a structural schematic diagram of a backlight source in the related art.

The backlight source in the related art generally includes a light bar and an iron frame, the light bar is arranged on one side of the iron frame, and the light bar includes a plurality of light-emitting units, and each light-emitting unit includes a plurality of light-emitting groups. The structure shown in FIG. 1 is a structural schematic diagram in which one light-emitting group M is disposed on the iron frame 01. As shown in FIG. 1, the light-emitting group M includes five light-emitting elements. Exemplarily, the five light-emitting elements are an LED light ①', an LED light ②', an LED light ③', an LED light ④' and an LED light ⑤' which are sequentially arranged on the iron frame 01. It is worth noting that the LED light ①', the LED light ②', the LED light ③', the LED light ④' and the LED light ⑤' are connected in series sequentially, that is, the current flows through the LED light ①', the LED light ②', the LED light ③', the LED light ④' and the LED light ⑤'.

The iron frame 01 is provided with a notch (that is, the perforated position), and the notch corresponds to the second pole of the LED light ⑤'. When the electro-static discharge (ESD) test is performed, the perforated position is unprotected, and the static electricity will directly act on the first pole of the LED light ⑤'. As the LED light ⑤' is subjected to electrostatic energy alone, damage of the LED light ⑤' will be caused.

In view of this, the present application provides a backlight source, which can prevent one light-emitting element from being subjected to electrostatic energy alone, thereby achieving the effect of preventing the ESD from damaging a single light-emitting element.

Figure 2:
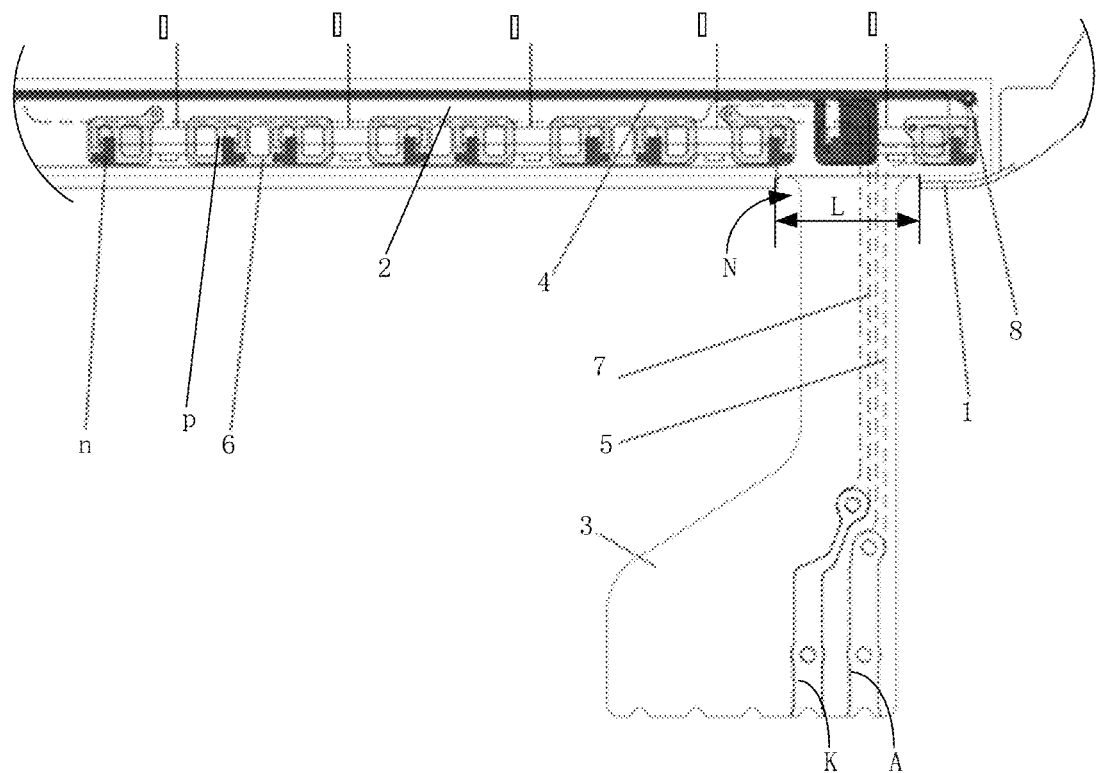
FIG. 2 is a structural schematic diagram of a backlight source provided by an embodiment of the disclosure.

Please refer to FIG. 2, the disclosure provides a backlight source, including a light bar and a metal frame 1 (such as an iron frame 1);

the light bar is located on one side of the iron frame 1; and the side, containing the light bar, of the iron frame 1 is provided with a notch N (that is, the perforated position);

the light bar includes a light-emitting unit;

the light-emitting unit includes a plurality of light-emitting groups; and the plurality of light-emitting groups include at least one first light-emitting group and at least one second light-emitting group; where the orthographic projection of the first light-emitting group on the iron frame 1 at least partially covers the notch N, and the orthographic projection of the second light-emitting group on the iron frame 1 and the notch N are non-overlapped.

Specifically, the first light-emitting group includes N light-emitting elements; the light-emitting element numbered n is connected in series with the light-emitting element numbered n+1 successively, where $1 \leq n \leq N-1$; the light-emitting element numbered 1 and the light-emitting element numbered N are arranged adjacently; and the light-emitting element numbered 1 and the light-emitting element numbered 2 are the farthest apart.

The second light-emitting group includes M light-emitting elements, the light-emitting element numbered m is connected in series with the light-emitting element numbered m+1 successively, where $1 \leq m \leq M-1$; and the light-emitting element numbered 1 and the light-emitting element numbered M are the farthest apart.

In an implementation manner, exemplarily, description is made by taking the first light-emitting group and the second light-emitting group each including five light-emitting elements as an example. It should be understood that other number of the light-emitting elements is also possible, and will not be repeated here.

When the five light-emitting elements in the first light-emitting group are specifically set, as shown in FIG. 2, the first light-emitting group specifically includes an LED light ①, an LED light ②, an LED light ③, an LED light ④ and an LED light ⑤. The LED light ①, the LED light ②, the LED light ③, the LED light ④ and the LED light ⑤ are sequentially connected in series; and the LED light ① numbered 1 and the LED light ⑤ numbered 5 are arranged adjacently; and the LED light ① numbered 1 and the LED light ② numbered 2 are the farthest apart. In other words, the five light-emitting elements in the first light-emitting group are not arranged in sequence and connected in series according to their physical positions.

Since the orthographic projection of the first pole of the LED light ① in the first light-emitting group on the iron frame 1 is at least partially located in the notch N, the LED light ① corresponds to the notch N of the iron frame 1 (that is, the perforated position). Specifically, when the static electricity entering from the notch N acts on the LED light ① numbered 1 in the first light-emitting group, the electrostatic current flows along the LED light ① numbered 1 through other light-emitting elements in the series-connected circuit in sequence until the current is transferred to the LED light ⑤ numbered 5, and the electrostatic energy flows through the entire series-connected first light-emitting group, so that the electrostatic energy is dispersed.

When the backlight source provided by the present application is specifically set, the light bar may also be set to include a first circuit board and a second circuit board; the above-mentioned first light-emitting group and second light-emitting group are both arranged on the first circuit board; and a positive input terminal A and a negative input terminal K are arranged on the first surface of the second circuit board, which satisfies that one light-emitting group is arranged between the positive input terminal A and the negative input terminal K. It is worth noting that the orthographic projection of the second circuit board on the iron frame 1 is at least partially located in the notch N, and the second circuit board and the iron frame 1 are non-overlapped. The width L of the notch N is one time or above the width of the second circuit board.

Please continue to refer to FIG. 2, the positive input terminal A is connected to a positive pad 4 welded to the first pole of the LED light ① through a positive input terminal trace routing wire 5 located on the second surface of the second circuit board; the second pole of the LED light ① is welded to a middle pad 6; a lead wire located on the second surface of the first circuit board connects the middle pad 6 welded to the second pole of the LED light ① with a middle pad 6 welded to the first pole of the LED light ②; a middle pad 6 welded to the second pole of the LED light ② is also welded to the first pole of the LED light ③; a middle pad 6 is arranged between every two adjacent LED lights of the LED light ③, the LED light ④ and the LED light ⑤; a middle pad 6 welded to the second pole of the LED light ⑤ is connected to the negative input terminal K through a negative input terminal routing wire 7 located on the second surface of the second circuit board 3.

It should be understood that the middle pad 6 plays a role in electrical connection, and the current can flow between the LEDs connected by the middle pad 6. Take the LED light ② in FIG. 2 as an example, the first pole is the positive pin n, and the second pole is the negative pin p.

It should be noted that the middle pad 6 welded to the second pole of the LED light ①, the middle pad 6 welded to the first pole of the LED light ②, and the middle pad 6 welded to the second pole of the LED light ⑤ shown in FIG. 2 are each only welded with one LED light; in order to save space, the structure of the above three middle pads 6 is only half of that of the middle pad 6 welded with two LED lights.

It is worth noting that the middle pad 6 welded to the second pole of the LED light ①, the middle pad 6 welded to the first pole of the LED light ②, and the middle pad 6 welded to the second pole of the LED light ⑤ are located on the same side of the first circuit board 2, so that when the above three middle pads 6 are connected to the routing wire or the lead on the other side of the first circuit board 2, via holes need to be formed on the middle pads 6. Exemplarily, as shown in FIG. 2, a via hole 8 is formed in the middle pad 6 welded to the second pole of the LED light ①.

Of course, when the positive input terminal A is connected to a positive input terminal routing wire 5, a via hole structure also needs to be arranged on the second circuit board; and when the negative input terminal K is connected to a negative input terminal routing wire 7, a via hole structure also needs to be arranged on the second circuit board 3.

Figure 3:
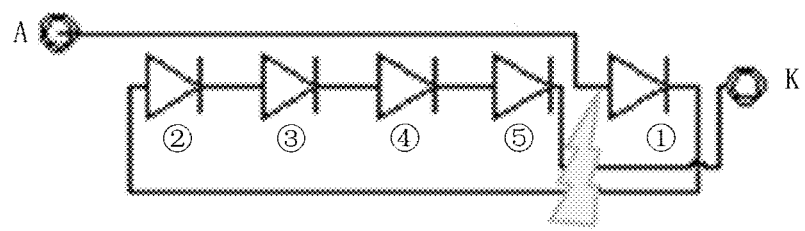
FIG. 3 is a simplified schematic diagram of an LED light bar in FIG. 2.

Please refer to the structure in FIG. 2 in conjunction with FIG. 3, in this embodiment, the current flow sequence is: the positive input terminal A, the LED light ①, the LED light ②, the LED light ③, the LED light ④, the LED light ⑤ and the negative input terminal K. When the static electricity directly acts on the first pole of the LED light ①, the static electricity flows in the above current flow sequence. Obviously, compared to the structure in the related art shown in FIG. 1, the LED ⑤' in the related art is changed into the LED light ① in the embodiment of the present application, so that the light-emitting element on which the electrostatic current acts is used as the light-emitting element numbered 1 in the first light-emitting group to make the electrostatic energy flow along the light-emitting element numbered 1 to the light-emitting element numbered 5 in sequence. In such a way, the electrostatic energy can be dispersed, the LED light ① can be prevented from being subjected to electrostatic energy alone, and electrostatic damage can be avoided.

It is worth noting that, since the orthographic projection of the second light-emitting group on the iron frame 1 and the notch N are non-overlapped, the structure in the second light-emitting group can adopt the arrangement form of LED light ①', LED light ②', LED light ③', LED light ④' and LED light ⑤' in the related art.

When the five light-emitting elements in the second light-emitting group are specifically set, the structure as shown in FIG. 1 is that the LED light ①', the LED light ②', the LED light ③', the LED light ④' and the LED light ⑤' are sequentially connected in series, and the LED light ①' numbered 1 and the LED light ⑤' numbered 5 in the five light-emitting elements are the farthest apart. In other words, the five light-emitting elements in the second light-emitting group are arranged in sequence and connected in series according to their physical positions.

Figure 4:
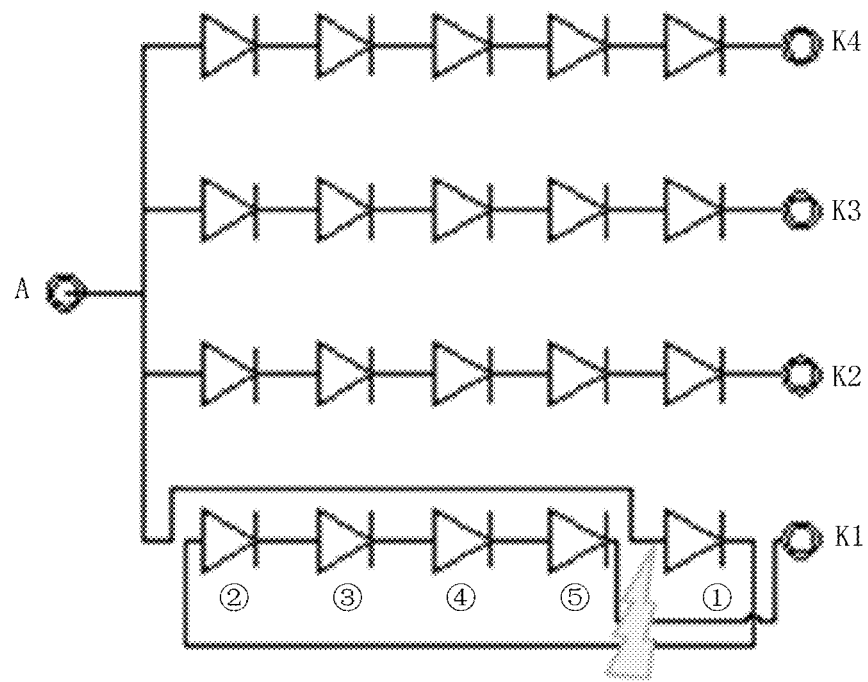
FIG. 4 is another simplified schematic diagram of the LED light bar in FIG. 2.

Of course, the backlight source provided by the embodiments of the present application may include multiple second light-emitting groups, as shown in FIG. 4, exemplarily, the backlight source includes three second light-emitting groups and one first light-emitting group. It should be understood that, in order to distinguish the negative input terminals K of the light-emitting groups in the backlight source, in FIG. 4, the negative input terminal of the first light-emitting group is marked by K1; and the negative input terminals of the three second light-emitting groups are respectively marked by K2, K3, and K4. It is worth noting that the first light-emitting group and the three second light-emitting groups share the same positive input terminal A as shown in FIG. 4.

In another implementation manner, exemplarily, description is made by taking the first light-emitting group and the second light-emitting group each including six light-emitting elements as an example. It should be understood that other number of light-emitting elements is also possible, which will not be repeated here.

Figure 5:
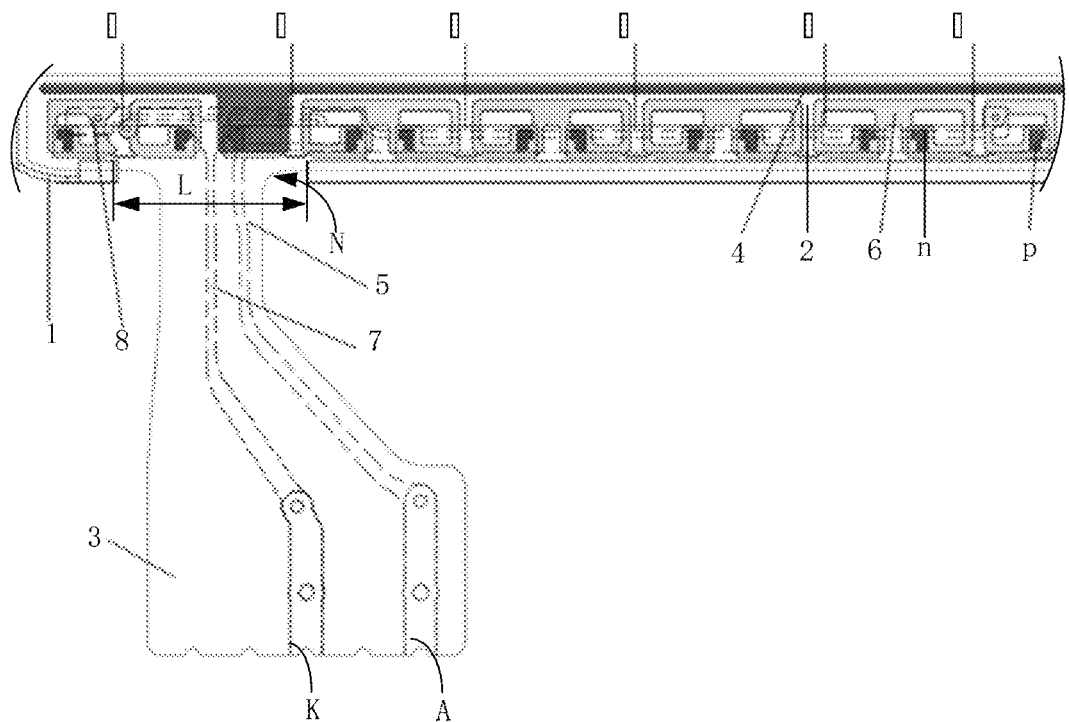
FIG. 5 is another structural schematic diagram of the backlight source provided by the embodiment of the disclosure.

When the six light-emitting elements in the first light-emitting group are specifically set, as shown in FIG. 5, the first light-emitting group specifically includes an LED light ①, an LED light ②, an LED light ③, an LED light ④, an LED light ⑤ and an LED light ⑥.

In the structure shown in FIG. 5, the LED light ①, the LED light ②, the LED light ③, the LED light ④, the LED light ⑤ and the LED light ⑥ are sequentially connected in series; the LED light ① numbered 1 and the LED light ⑥ numbered 6 are arranged adjacently; and the LED light ① numbered 1 and the LED light ② numbered 2 are the farthest apart. In other words, the six light-emitting elements in the first light-emitting group are not arranged in sequence and connected in series according to their physical positions. Since the orthographic projection of the second pole of the LED light ①in the first light-emitting group on the iron frame 1 is partially located in the notch N, the LED light ① corresponds to the perforated position of the iron frame 1. Specifically, when the static electricity entering from the notch N acts on the second pole of the LED light ① numbered 1 in the first light-emitting group, the electrostatic current flows along the LED light ① numbered 1 through the other light-emitting elements in the series-connected circuit in sequence until the current is transferred to the LED light ⑥ numbered 6; and since the electrostatic energy flows through the entire series-connected first light-emitting group, the electrostatic energy is dispersed.

Similarly, since the orthographic projection of the second light-emitting group on the iron frame 1 and the notch N are non-overlapped, the structure in the second light-emitting group can adopt the arrangement form in the related art.

When the backlight source provided by the present application is specifically set, the light bar can be set to further include a first circuit board 2 and a second circuit board 3, and the above-mentioned first light-emitting group and second light-emitting group are both arranged on the first circuit board 2. A positive input terminal A and a negative input terminal K are arranged on the first surface of the second circuit board 3, which satisfies that one light-emitting group is arranged between the positive input terminal A and the negative input terminal K. It is worth noting that the orthographic projection of the second circuit board 3 on the iron frame 1 is at least partially located in the notch N, and the second circuit board 3 and the iron frame 1 are non-overlapped. The width L of the notch N is one time or above the width of the second circuit board 3.

Specifically, the positive input terminal A is connected to a positive pad 4 welded to the first pole of the LED light ⑥ through a positive input terminal routing wire located on the second surface of the second circuit board 3; a middle pad welded to the second pole of the LED light ⑥ is welded with the LED light ⑤; the LED light ⑤, the LED light ④, the LED light ③ and the LED light ② are connected by middle pads 6 successively; the first pole of the LED light ① is welded to a middle pad 6, which is connected to a middle pad 6 welded to the second pole of the LED light ② through a lead wire located on the second surface of the circuit board 2; and the second pole of the LED light ① is welded with a middle pad 6 and is connected with the negative input terminal K through a negative input terminal routing wire on the second surface of the second circuit board 3.

It should be understood that the middle pad 6 plays a role in electrical connection, and current can flow between the LEDs connected by the middle pad 6. Take the LED light ② in FIG. 2 as an example, the first pole is the positive pin n, and the second pole is the negative pin p.

It should be noted that, as shown in FIG. 5, since the middle pad 6 welded to the first and second poles of the LED light ① and the middle pad 6 welded to the second pole of the LED light ② are each only welded with one LED light, the structure of the middle pad 6 only welded with one LED light is only half of that of the middle pad 6 welded with two LED lights.

It is worth noting that, similarly, since the middle pad 6 welded to the first pole of the LED light ① and the middle pad 6 welded to the second pole of the LED light ② are located on the same side of the first circuit board 2, then when the above two middle pads 6 are connected to the routing wire or lead located on the other side of the first circuit board 2, via holes need to be formed in the middle pad 6. Exemplarily, as shown in FIG. 5, a via hole 8 is formed in the middle pad 6 welded to the first pole of the LED light ①.

Of course, when the positive input terminal A is connected to a positive input terminal routing wire 5, a via hole structure also needs to be arranged on the second circuit board 3; and when the negative input terminal K is connected to a negative input terminal routing wire 7, a via hole structure also needs to be arranged on the second circuit board 3.

Figure 6:
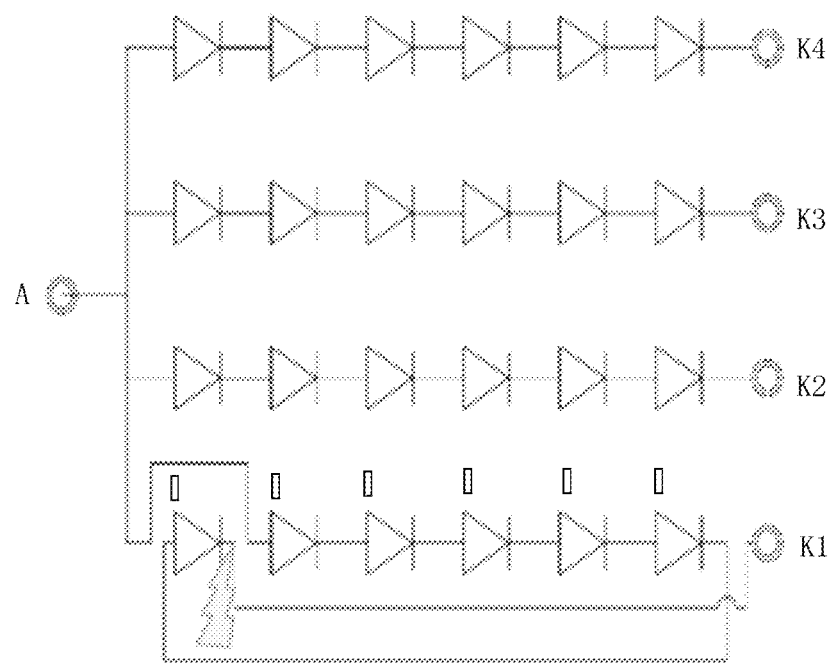
FIG. 6 is a simplified schematic diagram of an LED light bar in FIG. 5.

Please refer to FIG. 5 in conjunction with FIG. 6, the current flow sequence in the embodiment of this application is: the positive input terminal A, the LED light ⑥, the LED light ⑤, the LED light ④, the LED light ③, the LED light ②, the LED light ① and the negative input terminal K. When static electricity directly acts on the second pole of the LED light ①, the static electricity flows in the opposite current flow sequence. The specific flow sequence is the LED light ①, the LED light ②, the LED light ③, the LED light ④, the LED light ⑤ and the LED light ⑥.

Obviously, compared with the structure shown in FIG. 1, the backlight source in the embodiment of the present application changes the position of the LED light ① in the embodiment of the present application by changing the LED light ⑤' in the related art into the LED light ① in the embodiment to make the light-emitting element on which the electrostatic current acts be regarded as the light-emitting element numbered 1 in the first light-emitting group, so that the electrostatic energy can flow along the light-emitting element numbered 1 to the light-emitting element numbered 6 sequentially. In such a way, the electrostatic energy is dispersed, and the LED light ① can be prevented from being subjected to the electrostatic energy alone, thereby avoiding electrostatic damage.

Of course, the backlight source provided by the embodiments of the present application may include multiple second light-emitting groups, as shown in FIG. 6, exemplarily, the backlight source includes three second light-emitting groups and one first light-emitting group. It should be understood that, in order to distinguish the negative input terminals K of the light-emitting groups in the backlight source, in FIG. 6, the negative input terminal of the first light-emitting group is marked by K1, and the negative input terminals of the three second light-emitting groups are respectively marked by K2, K3, and K4. It is worth noting that the first light-emitting group and the three second light-emitting groups share the same positive input terminal A as shown in FIG. 6.

In the second aspect, the disclosure also provides display device, including any one of the backlight sources provided by the above technical solutions.

Obviously, those skilled in the art can make various changes and variations to the disclosure without departing from the spirit and scope of the disclosure. In this way, if these modifications and variations of the disclosure fall within the scope of the claims of the present application and their equivalent technologies, the disclosure is also intended to include these changes and variations.

What is claimed is:

1. A backlight source, comprising a light bar and a metal frame; wherein
   the light bar is arranged on one side of the metal frame, wherein the side, comprising the light bar, of the metal frame has a notch;
   the light bar comprises a light-emitting unit;
   the light-emitting unit comprises a plurality of light-emitting groups; and each of the plurality of light-emitting groups comprises at least one first light-emitting group and at least one second light-emitting group;

wherein the first light-emitting group comprises N light-emitting elements; the light-emitting element numbered n is connected in series with the light-emitting element numbered n+1 successively, wherein $1 \le n \le N-1$; the light-emitting element numbered 1 and the light-emitting element numbered N are arranged adjacently; and the light-emitting element numbered 1 and the light-emitting element numbered 2 are farthest apart; and the second light-emitting group comprises M light-emitting elements; the light-emitting element numbered m is connected in series with the light-emitting element numbered m+1 successively, wherein $1 \le m \le M-1$; and the light-emitting element numbered 1 and the light-emitting element numbered M are farthest apart.

2. The backlight source according to claim 1, wherein an orthographic projection of the first light-emitting group on the metal frame at least partially covers the notch; and an orthographic projection of the second light-emitting group on the metal frame and the notch are non-overlapped.

3. The backlight source according to claim 1, wherein the light bar further comprises a circuit board, the circuit board comprises a first circuit board and a second circuit board that are connected to each other, and the light-emitting unit is arranged on the first circuit board.

4. The backlight source according to claim 3, wherein an orthographic projection of the second circuit board on the metal frame is at least partially arranged in the notch, and the second circuit board and the metal frame are non-overlapped.

5. The backlight source according to claim 4, wherein the first circuit board has middle pads, a first pole and a second pole of each of the light-emitting elements are respectively fixed to two adjacent middle pads, and the each light-emitting group has at least one positive pad.

6. The backlight source according to claim 5, wherein the second circuit board has at least one positive input terminal and at least one negative input terminal;

one of the light-emitting groups is arranged between the positive input terminal and the negative input terminal;

the positive input terminal is electrically connected to a positive pole of the light-emitting element numbered 1 in the one light-emitting group through the positive pad; and the negative input terminal is electrically connected to a negative pole of the light-emitting element numbered N or M in the one light-emitting group.

7. The backlight source according to claim 6, wherein each of the light-emitting groups comprise one first light-emitting group and multiple second light-emitting groups; and the one first light-emitting group and the multiple second light-emitting groups share a same positive input terminal.

8. The backlight source according to claim 5, wherein the middle pads arranged on a same side of the first circuit board have a via hole.

9. The backlight source according to claim 5, wherein a structure of the middle pad only welded to one light-emitting element is half of that of the middle pad welded to two light-emitting elements.

10. The backlight source according to claim 2, wherein an orthographic projection of the light-emitting element numbered 1 in the first light-emitting group on the metal frame is at least partially arranged in the notch.

11. The backlight source according to claim 3, wherein a width of the notch is one time or above a width of the second circuit board.

12. A display device, comprising a display panel and the backlight source according to claim 1.

13. The display device according to claim 12, wherein an orthographic projection of the first light-emitting group on the metal frame at least partially covers the notch; and an orthographic projection of the second light-emitting group on the metal frame and the notch are non-overlapped.

14. The display device according to claim 12, wherein the light bar further comprises a circuit board, the circuit board comprises a first circuit board and a second circuit board that are connected to each other, and the light-emitting unit is arranged on the first circuit board.

15. The display device according to claim 14, wherein an orthographic projection of the second circuit board on the metal frame is at least partially arranged in the notch, and the second circuit board and the metal frame are non-overlapped.

16. The display device according to claim 15, wherein the first circuit board has middle pads, a first pole and a second pole of each of the light-emitting elements are respectively fixed to two adjacent middle pads, and the each light-emitting group has at least one positive pad.

17. The display device according to claim 16, wherein the second circuit board has at least one positive input terminal and at least one negative input terminal;

one of the light-emitting groups is arranged between the positive input terminal and the negative input terminal;

the positive input terminal is electrically connected to a positive pole of the light-emitting element numbered 1 in the one light-emitting group through the positive pad; and the negative input terminal is electrically connected to a negative pole of the light-emitting element numbered N or M in the one light-emitting group.

18. The display device according to claim 16, wherein a structure of the middle pad only welded to one light-emitting element is half of that of the middle pad welded to two light-emitting elements.

19. The display device according to claim 13, wherein an orthographic projection of the light-emitting element numbered 1 in the first light-emitting group on the metal frame is at least partially arranged in the notch.

20. The display device according to claim 14, wherein a width of the notch is one time or above a width of the second circuit board.

* * * * *